(12) United States Patent
Owen et al.

(10) Patent No.: US 8,508,032 B2
(45) Date of Patent: Aug. 13, 2013

(54) CHIP PACKAGING

(75) Inventors: Martyn Robert Owen, Suffolk (GB);
Andrew George Holland,
Cambridgeshire (GB)

(73) Assignee: Cambridge Silicon Radio Limited,
Cambridge (GB)

( * ) Notice: Subject to any disclaimer, the term of this patent is extended or adjusted under 35 U.S.C. 154(b) by 124 days.

(21) Appl. No.: 12/742,063

(22) PCT Filed: Oct. 20, 2008

(86) PCT No.: PCT/EP2008/064134
§ 371 (c)(1),
(2), (4) Date: Jun. 18, 2010

(87) PCT Pub. No.: WO2009/059883
PCT Pub. Date: May 14, 2009

(65) Prior Publication Data
US 2011/0278728 A1 Nov. 17, 2011

(30) Foreign Application Priority Data

Nov. 8, 2007 (GB) .................................. 0721927.2

(51) Int. Cl.
*H01L 29/41* (2006.01)
(52) U.S. Cl.
USPC ...... 257/692; 257/693; 257/773; 257/E21.01; 257/E21.506
(58) Field of Classification Search
USPC ............. 257/692, 693, 77, E23.01, E21.506; 174/261; 438/127
See application file for complete search history.

(56) References Cited

U.S. PATENT DOCUMENTS

| 5,467,252 | A | * | 11/1995 | Nomi et al. | 361/760 |
|---|---|---|---|---|---|
| 6,118,174 | A | | 9/2000 | Kim | |
| 6,538,313 | B1 | * | 3/2003 | Smith | 257/684 |
| 7,095,096 | B1 | | 8/2006 | Mostafazadeh | |
| 7,618,849 | B2 | * | 11/2009 | Khan et al. | 438/127 |
| 2001/0045625 | A1 | | 11/2001 | Sakamoto et al. | |
| 2003/0057542 | A1 | * | 3/2003 | Frezza et al. | 257/693 |
| 2004/0104457 | A1 | | 6/2004 | Tan | |
| 2008/0036096 | A1 | * | 2/2008 | Karnezos | 257/778 |
| 2008/0296751 | A1 | * | 12/2008 | Fan | 257/693 |
| 2009/0057871 | A1 | * | 3/2009 | Zhao et al. | 257/693 |
| 2010/0019360 | A1 | * | 1/2010 | Khan et al. | 257/675 |

FOREIGN PATENT DOCUMENTS

| JP | 08-083878 A | 3/1996 |
|---|---|---|
| JP | 11-026648 A | 1/1999 |

* cited by examiner

*Primary Examiner* — Allan R Wilson
(74) *Attorney, Agent, or Firm* — Novak Druce Connolly Bove + Quigg LLP

(57) ABSTRACT

An electronic device package comprising: a block of insulating material; an electronic device housed within the insulating material and having a set of contact pads thereon; and a set of electrically conductive contact members at least partially housed within the insulating material, each contact member extending between a respective external contact point at which it is exposed at the surface of the block and an internal contact point from which it is electrically coupled to a respective contact pad on the electronic device, each internal contact point being outside the footprint of the electronic device, the set of contact members including: at least one contact member of a first type whose external contact point is located at least partially within the footprint of the electronic device; and at least one contact member of a second type that is wholly outside the footprint of the device.

28 Claims, 5 Drawing Sheets

CHIP PACKAGING

BACKGROUND OF THE INVENTION

This invention relates to packaging electronic devices such as integrated circuits (ICs).

Integrated circuits are normally fabricated on a silicon wafer. The wafer may carry multiple separate ICs. The wafer is then cut up so that each IC is on an individual die, and the dies are then packaged for protection inside an insulating housing which has external contacts by which electrical connections can be made to the IC.

FIG. 1 shows partial cross-sections of four types of IC package. Like components are designated with the same reference numerals in each type of package.

Package 1 is a quad flat pack (QFP) package. The IC die 2 is mounted to a die attach pad 3 by adhesive 4. Leads 5 are attached to the die by wires 6 and the whole assembly is encapsulated in a block 7 of an insulating material. In the QFP package the leads 5 extend outside the footprint of the block 7 of insulating material.

Package 8 is a quad flat no-lead (QFN) package. In this package the leads 5 are flush with the lower surface of the block 7 and lie within the footprint of the block. Since the leads do not extend outside the footprint of the block, this yields a smaller package than the QFP technique.

Package 9 is a chip on lead (COL) package. In this package the leads extend under the die and so the leads, rather than a die attach pad, support the die. The leads are still connected to the die by wires 6.

Package 10 is a flip-chip on lead (FOL) package. In this package the leads are coupled directly to the die by means of solder balls 11, without the need for wires.

Finally, package 12 is a ball grid array (BGA) package. The die is coupled to a circuit board 13 which is packaged in the block 7 along with the die. The circuit board contains tracks 14 which terminate in exposed pads within the footprint of the block. In packages 1, 8, 9 and 10 the leads 5 terminate around the periphery of the package, whereas the BGA arrangement allows the pads 14 to be configured in an array over the lower surface of the block 7.

All these packaging arrangements suffer from disadvantages. The QFP package is relatively large because the leads extend outside the block 7. In the QFN, COL and FCOL packages the external contacts are arranged in a row around the periphery of the package, which restricts the number of external contacts that can be provided if connections are to be made reliably to the contacts. The BGA package allows the external contacts to be spread over the area of the package but it requires the circuit board 13, which increases its cost.

There is therefore a need for an improved design of package for electronic devices.

SUMMARY OF THE INVENTION

According to one aspect of the present invention there is provided an electronic device package comprising: a block of insulating material; an electronic device housed within the insulating material and having a set of contact pads thereon; and a set of electrically conductive contact members at least partially housed within the insulating material, each contact member extending between a respective external contact point at which it is exposed at the surface of the block and an internal contact point from which it is electrically coupled to a respective contact pad on the electronic device, each internal contact point being outside the footprint of the electronic device, the set of contact members including: at least one contact member of a first type whose external contact point is located at least partially within the footprint of the electronic device; and at least one contact member of a second type that is wholly outside the footprint of the device.

According to a second aspect of the present invention there is provided a method of manufacturing an electronic device package, the method comprising: attaching to an electronic device having a set of contact pads thereon a set of electrically conductive contact members, each contact member extending between a respective external contact point and an internal contact point from which it is electrically coupled to a respective contact pad on the electronic device, each internal contact point being outside the footprint of the electronic device and the set of contact members including at least one contact member of a first type whose external contact point is located at least partially within the footprint of the electronic device and at least one contact member of a second type that is wholly outside the footprint of the device; and encapsulating the device in a block of insulating material such that the external contact points of the contact members are exposed at the surface of the block.

A plurality of the contact members may be arranged in a row along an edge of the electronic device. The contact members of the said plurality may be alternately of the first type and the second type along the row.

The said plurality of the contact members may collectively extend parallel to an edge of the block of insulating material.

The internal contact points of the said plurality of contact members may be substantially collinear. Alternatively, the internal contact points of the contact members of the first type among the said plurality of contact members may be located closer to the electronic device than the internal contact points of the contact members of the second type among the said plurality of contact members.

The external contact points of adjacent pairs of the said plurality of contact members may be substantially aligned in a direction perpendicular to the extent of the said plurality. The external contact points of adjacent contact members of the said plurality of contact members may be offset in a direction parallel to the extent of the said plurality.

The block of insulating material suitably has a base at which the external contact points are exposed.

Each contact member of the second type may be of a constant cross-section in a plane parallel to the base of the block of insulating material.

The width of the contact members of the first type at their internal contact points may be less than the width of the contact members of the first type at their external contact points. The width is suitably measured parallel to, for example, the base of the package or the plane of the electronic device.

The or each contact member of the first type may be exposed at the surface of the block at locations both inside and outside the footprint of the electronic device. Alternatively, the contact members of the first type may be exposed at the surface of the block of insulating material only inside the footprint of the electronic device.

The depth of the contact members of the first type at their internal contact points may be less than the depth of the contact members of the first type at their external contact points. The depth is suitably measured perpendicular to, for example, the base of the package or the plane of the electronic device.

The contact members of the first type may be formed of etched metal, for example etched copper. By this means, or by other means such as by folding, some parts of the contact members of the first type may extend further in a direction from the interior towards the side of the package at which they are exposed than do other parts.

Each contact member may be electrically coupled by a wire to the respective contact pad on the electronic device.

Each contact member may be constituted by a unitary element of material.

The external contact points of at least some of the contact members may extend out of the block of insulating material.

The contact members may be located wholly within the block of insulating material.

The electronic device package may comprise a further conductive member located wholly within the footprint of the electronic device and extending between a respective external contact point at which it is exposed at the surface of the block and an internal contact from which it is coupled to the electronic device.

The further conductive member may be a die attach pad.

The electronic device may be substantially planar.

The electronic device may be an integrated circuit die.

The contact points may be singular locations on the contact members or may be contact pads occupying a region of the surface of the contact members.

According to a further aspect of the invention there is provided an integrated circuit having an electronic device package as set out above attached thereto, the external contact points of the package being soldered to respective contact points on the integrated circuit without solder bridging to nearby ones of the contact points.

According to a further aspect of the invention there is provided a sheet of conductive material configured to define a plurality of contact members, the sheet being arranged in such a pattern as to be suitable for forming an electronic device package as set out above.

According to a further aspect of the invention there is provided a sheet of electrically conductive material for forming contact members of an electronic device package, the sheet being patterned to comprise: support strips extending around a package region, the package region comprising an interior region and a peripheral region surrounding the interior region; and a plurality of fingers extending from the support strips into the package region to define contact members, the fingers including: fingers of a first type that extend from the strips through the peripheral part of the package region into the interior part of the package region, and fingers of a second type that extend from the strips only into the peripheral part of the package region.

The depth of the fingers of the first type may be greater where they lie in the interior region than where they lie in the peripheral region.

The width of the first set of fingers may be greater where they lie in the interior region than where they lie in the peripheral region.

Along at least part of a strip fingers of the first and second type may alternate.

According to a further aspect of the present invention there is provided a sheet of electrically conductive material for forming contact members of a plurality of electronic device packages, the sheet comprising a plurality of sheets as set out above interconnected by their strips.

BRIEF DESCRIPTION OF THE DRAWINGS

The present invention will now be described by way of example with reference to the accompanying drawings.

In the drawings.

DETAILED DESCRIPTION OF THE INVENTION

In the packages shown in the figures an integrated circuit die is packaged in a block of insulating material. The block incorporates conductive leads that terminate in pads at the outer surface of the block. Some of the pads are within the footprint of the die and are defined by leads of varying thickness. Thicker parts of those leads provide the pads. Thinner parts are spaced from the exterior of the block of insulating material and extend to outside the footprint of the die, where they are coupled to the die by wires.

Figure 1:
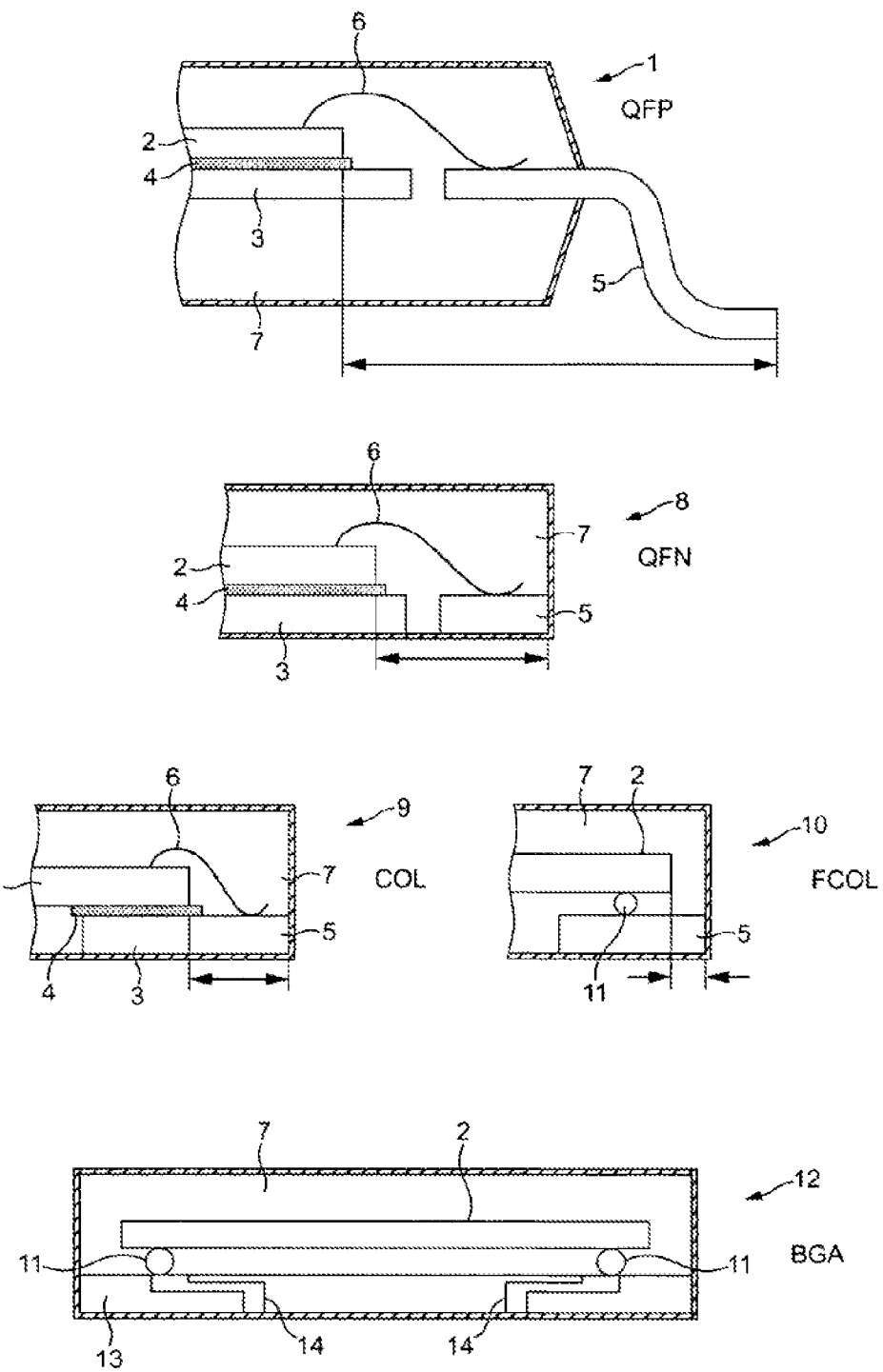
FIG. 1 shows examples of conventional packages.
Figure 2:
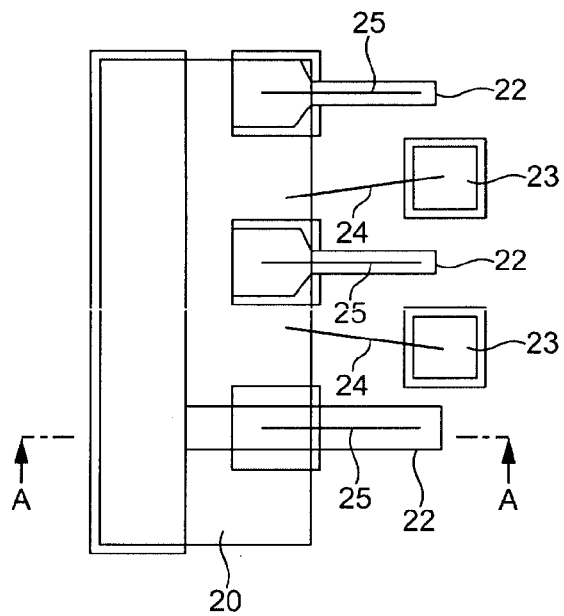
FIG. 2 shows a plan view of part of a first design of package.
Figure 3:
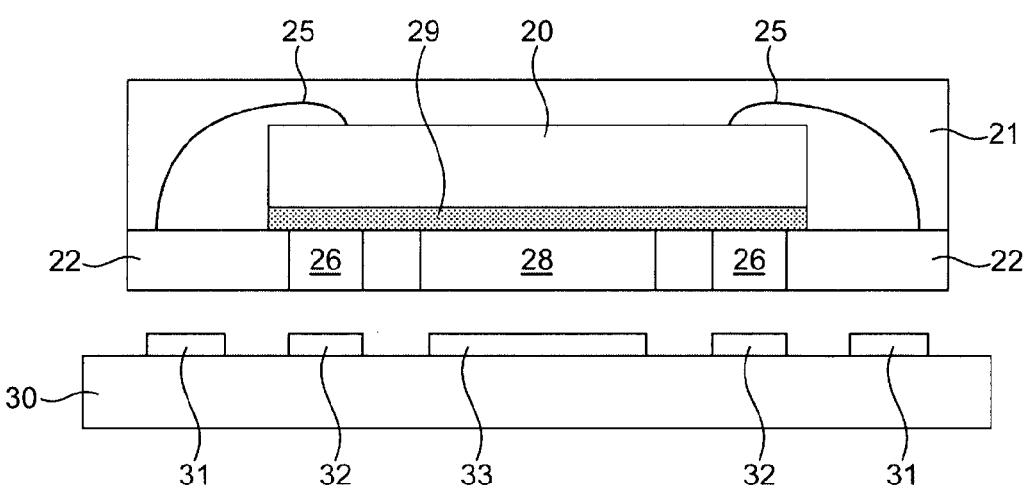
FIG. 3 shows a cross-section of the whole of the first design of package on a continuation of the line A-A of FIG. 1.

FIGS. 2 and 3 illustrate a first design of package. The package of FIGS. 2 and 3 comprises an integrated circuit die 20 which is encapsulated in a block 21 of insulating mould compound. For clarity the mould compound is not shown in FIG. 2. The package has leads 22 of a first type and leads 23 of a second type. The leads 23 terminate in contact pads outside the footprint of the die. The leads 22 terminate in contact pads within the footprint of the die, but are shaped so that they are not exposed at the exterior of the die contiguously to the contact pads of the leads 23.

The leads 23 are straightforward blocks of conductive material of square plan (as shown in FIG. 2). The leads 23 are of a uniform thickness in the direction perpendicular to the lower face of the package, and lie wholly outside the footprint of the die. Each of the leads 23 is wirebonded to a respective contact point on the die. The contact point is defined by a conductive pad (e.g. of aluminium) on the surface of the die. The wirebonding is implemented by means of a wire 24 of a conductive material such as gold. The leads 23 are exposed on the lower surface of the package constituting an external contact point outside the footprint of the die, as is apparent from FIG. 2. To effect this, each lead 23 has a lower surface that lies below the level of the die. When the leads and the die are packaged in the mould compound, the mould compound is arranged so that the lower surface of each lead 23 is exposed so that it can serve as a pad for connecting the die to another entity such as a circuit board. Conveniently, this is achieved by the lower surface being flush with the lower surface of the package, but the lower surfaces could be in indentations in the block or could be proud of the block. The contact pads from leads 23 could be at the sides of the block instead of or in addition to being at the base of the block. However, it is preferred that all the leads are exposed at one surface of the block, since that makes it easier to attach the block to a circuit board. The leads 23 could be made of copper.

The leads 22 are each configured to extend from a point outside the footprint of the die to a point inside the footprint of the die. At a location on the leads 22 outside the footprint of the die they are wirebonded to respective contact points on the die 20 by wires 25 in a similar way to the leads 23. At least a location on the leads 22 inside the footprint of the die they are exposed on the lower surface of the package, constituting an external contact point 26 inside the footprint of the die, as shown in FIG. 3. To effect this, each lead 22 has a lower surface that lies below the level of the die. When the leads and the die are packaged in the mould compound, the mould compound is arranged so that the lower surface of each lead 22 is exposed so that it can serve as a pad for connecting the die to another entity such as a circuit board. Conveniently, this is achieved by the lower surface being flush with the lower surface of the package, but the lower surfaces could be in indentations in the block or could be proud of the block. The leads 22 could be made of copper.

Thus external contact pads are provided both inside and outside the footprint of the die. This provides a particularly dense array of pads for connections to the die, without the need for a circuit board as in a BGA.

As illustrated in FIG. 2, the spacing between the center of the pads provided by leads 22 and leads 23 in the direction perpendicular to the nearest edge of the die could be 0.5 mm, but it could be more or less than that.

The die 20 is preferably bonded to a conductive pad 28 by epoxy 29. When the die is mounted on a PCB that pad 28 may act as a heat sink.

As shown in FIG. 3, the package may be mounted to a PCB 30 having two rows of contacts 31, 32 whose positions correspond to those of the pads provided by the leads 23 and 22 respectively. A pad 33 may also be provided on the PCB to make contact with the pad 28 for better thermal conduction.

Leads 22 and 23 are both present outside the footprint of the die. Since the leads should be electrically isolated from each other, it is preferred to enhance the spacing between the leads where practicable, so as to reduce the chance of external contact inadvertently making connections between adjacent leads. In the embodiment of FIGS. 2 and 3 this is achieved by the leads 22 being located between the leads 23 in the direction parallel to the nearest edge of the die, and by the leads 22 being narrower in the direction parallel to the nearest edge of the die at their nearest point to the leads 23 than at the point where they serve as pads inside the footprint of the die. In the example shown in the figures, each of the leads 22 is composed of an outer section that is relatively narrow in the axis parallel to the edge of the die that lead 22 intersects and an inner section that is relatively wide in that axis. The relatively narrow section improves the spacing between the leads 22 and the leads 23 whilst the relatively wide section provides a suitably sized pad for off-package connections.

Figure 4:
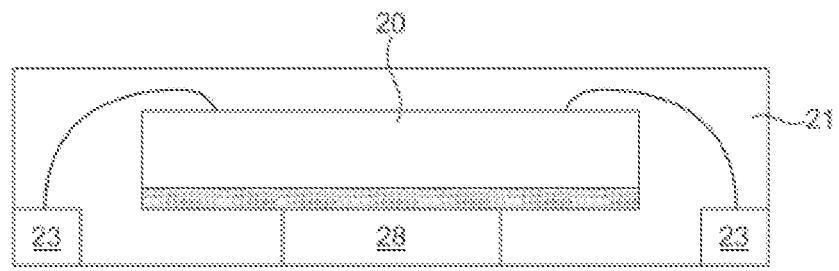
FIG. 4 shows a first cross section of a second design of package.
Figure 5:
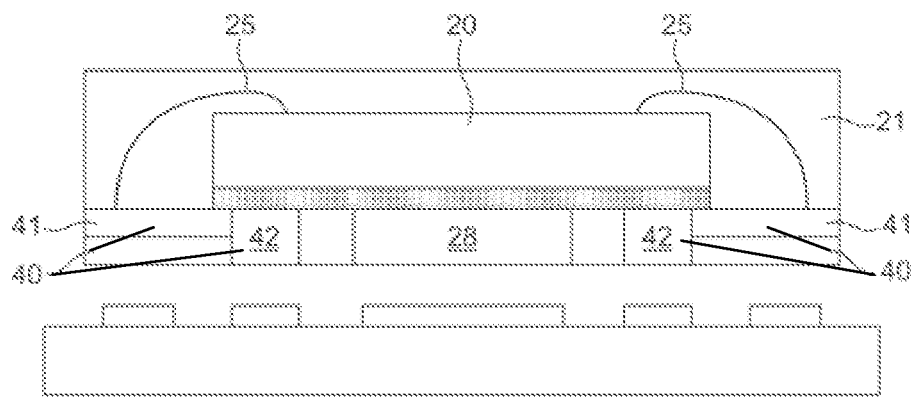
FIG. 5 shows a second cross section of the second design of package.

In the embodiment of FIGS. 2 and 3 the leads 22 are of uniform cross-section in the axis perpendicular to the plane of the die (as shown in FIG. 3). In the embodiment of FIGS. 4 and 5, the equivalent leads 40 are of a non-uniform cross-section. Thinner regions 41 are thinner than regions 42 in the plane of the die: i.e. in a direction perpendicular to the surface of the block at which the pads provided by regions 40 are exposed. Preferably the regions 41 and 42 are provided by a unitary conductive element, which can conveniently be formed in two thicknesses by partially etching away selected regions that are desired to be thinned. Alternative fabrication methods could include folding the element so as to provide the thicker region as a leg extending out of the plane of the thinner region, or by bonding a thicker portion to a separate thinner portion.

In FIGS. 4 and 5, like components are designated as in FIGS. 2 and 3. In the embodiment of FIGS. 4 and 5 the leads 23 are the same as those used in the embodiment of FIGS. 2 and 3. However, instead of leads 22 of uniform cross-section, as outlined above the equivalent leads 40 have a relatively shallow section 41 and a relatively deep section 42. At least part, and preferably all, of the deep section 42 lies inside the footprint of the die. At least some of the shallow section 41 lies outside the footprint of the die, and preferably all those portions of the leads 40 that lie outside the footprint of the die are of the relatively shallow section. The surfaces of the relatively shallow sections closest to the die (the upper surfaces in FIG. 5) are co-planar with the upper surfaces of the relatively deeper sections. This has the effect that the opposite (lower) surfaces of the relatively shallow portions are not exposed at the lower surface of the package. This has the advantage that in the regions nearest the leads 23 the leads 40 are not exposed, making it easier to make external connections to leads 23 without inadvertently bridging to leads 40

The relatively shallow and relatively deep sections of each lead are preferably of a unified piece of material. The profile of the piece could be formed by differential etching of the region that is to form the relatively shallow part, as will be described in more detail below, or by other means suitable to the overall process that is being employed.

The process of forming the package may proceed as follows.

The die is manufactured as normal, for example by forming an integrated circuit on a semiconductor wafer and dicing the wafer to form a set of individual dies.

Figure 6:
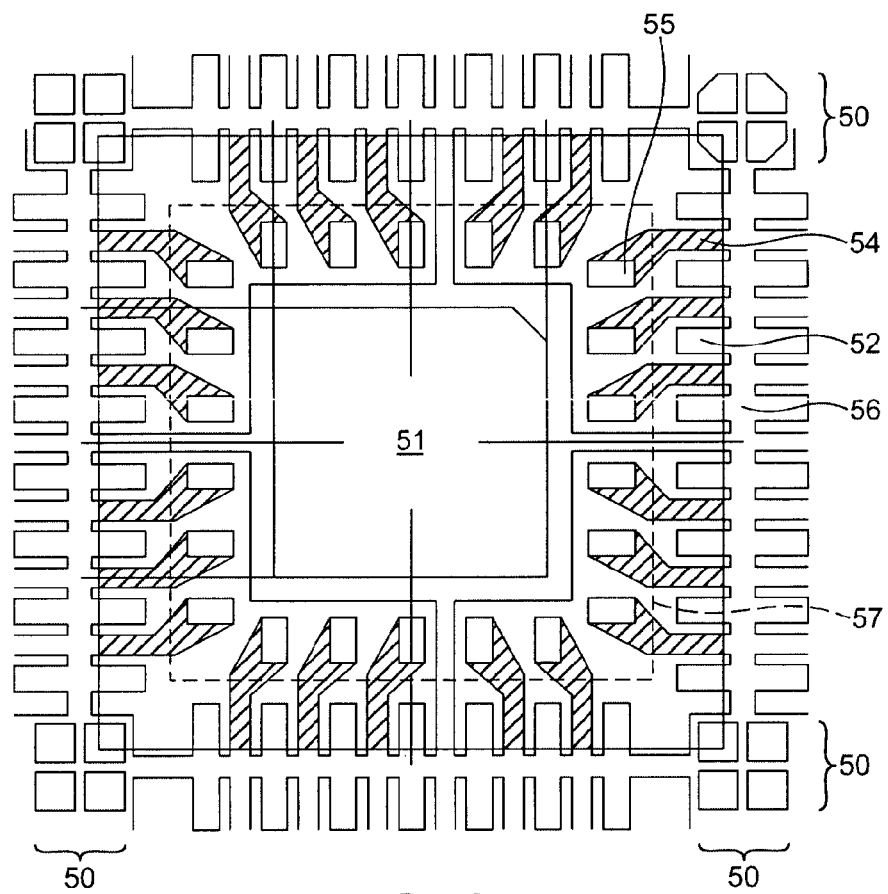
FIG. 6 shows part of a sheet for forming contact members.

The leads are formed from a sheet of copper material. The sheet has been etched to the shape shown in FIG. 6, where the shaded regions and the regions occupied by pads 52, 55 and 51 indicate material that is present and the remainder of the sheet is absent. As will become apparent, the entirety of the sheet provides connections for multiple dies, but only part of the sheet is shown in FIG. 6. The sheet has also been differentially etched so that the shaded portions of the sheet are shallower than the non-shaded portions. This can be achieved by masking the areas that are to be etched and applying an etchant for sufficient time to reduce the thickness to the desired level.

The sheet defines a pad 51 which corresponds to pad 28 of FIGS. 4 and 5. This is a die attach pad to which a central part of the die can be bonded, e.g. by epoxy, when the die is to be coupled to the sheet. The die attach pad has the full thickness of the sheet so that it can be exposed at the surface of the eventual package and then make contact with a heat-sink pad on a circuit board to which the package is mounted. The sheet also has pads 52 which correspond to pads 23 of FIGS. 4 and 5, pads 55 which correspond to pads 42 of FIGS. 4 and 5 and necks 54 which correspond to the shallower regions 41 of FIGS. 4 and 5. These are all attached to webs 56 which run around the periphery of this region of the sheet and hold the other components of the sheet in place relative to each other. Pads 52 are directly connected to the webs. Similar structures for attachment to other pads may extend from the opposite edges of the webs, so the sheet defines a lattice of structures for attachment to multiple dies.

Once the sheet has been shaped by, for example etching, the die is bonded to the pad 51 with epoxy on the side from which the removal of material (e.g. by etching) has not taken place. On that side of the sheet the material of the sheet that is present has a uniform planar surface. When the die is in place on the pad 51 its perimeter will be located as shown by dashed line 57. When it is in place on the pad the die will overlap regions 55, but will not overlap regions 52 or the outermost parts of regions 54. Thus regions 52 and 54 will be exposed, allowing them to be wirebonded to the die.

The die is then wirebonded to the regions 52 and 54. Multiple dies may be attached to respective portions of the sheet in a similar way.

The whole sheet is then coated in mould compound in such a way that the die is enclosed by the compound but the surfaces of the regions 52, 55 that face away from the die are exposed at its surface. Then the structure is diced by sawing along the channels indicated at 50 in FIG. 6. This separates the structure into individual packages.

Figure 7:
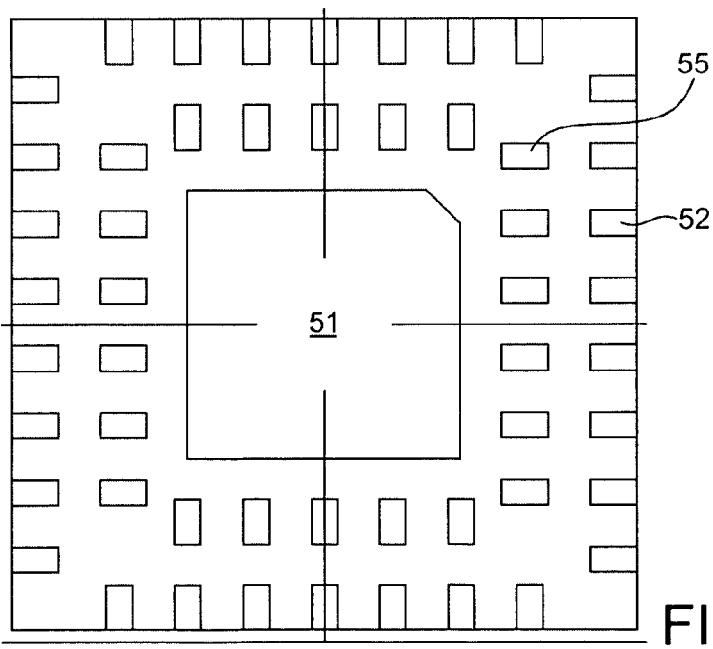
FIG. 7 shows the external pad layout of a package.

FIG. 7 shows the pattern of contacts on the lower surface of the resulting package. In this example there are two rows of contacts around the die. One row lies inside the footprint of the die and the other lies outside the footprint of the die. The contacts could be arranged in other ways. For example, the contacts in one row could be staggered relative to those in the next row. There could be more than two rows of contacts. The contacts need not be arranged in rows: they could be distributed in a less orderly manner.

Figure 8:
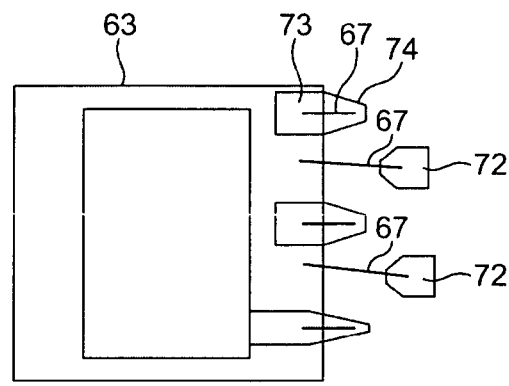
FIG. 8 is a partial plan view of a third design of package.
Figure 9:
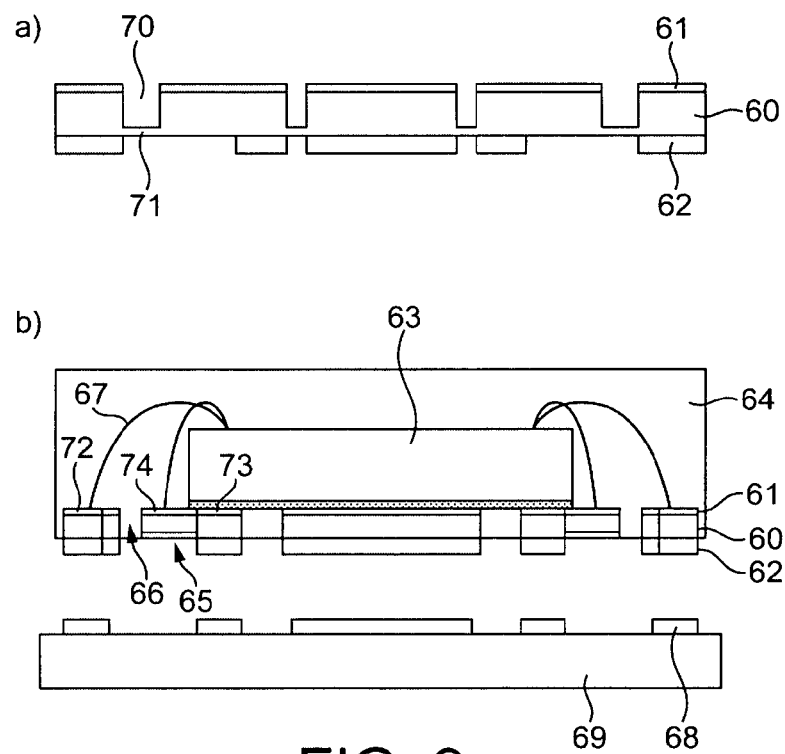
FIG. 9 shows steps a and b in the production of the package of FIG. 8.

FIGS. 8 and 9 illustrate an embodiment that can be manufactured by a technique in which the conductive frame that provides the leads inside the package is etched from both sides. FIG. 8 is a partial plan view of the package and FIG. 9 shows steps a and b in the production of the package.

In a first step (FIG. 9*a*) a copper sheet 60 is selectively coated on both sides with layers 61, 62 of a conductive etch-resistant material such as nickel-gold. The pattern in which the nickel-gold is coated on either side of the copper sheet is different. The copper sheet is then exposed to an etchant on one side (the upper side in FIG. 9*a*) to etch partially through the copper sheet. This leaves cut-outs 70 between the nickel-gold, with necks 71 in the etched regions joining the un-etched regions together.

Then the die 63 is coated with adhesive, for example by means of a die attach film, and is bonded to the sheet in the configuration illustrated in FIG. 9*b*. Wirebonding 67 connects appropriate regions of the die to appropriate regions of the nickel-gold, and then the sheet and the die are encapsulated in a block 64 of insulating material. The lower portions of the sheet and/or the nickel/gold are exposed at or protrude from the lower surface of the die. The sheet is then subjected to a second etch step in which the etchant is exposed to the lower surface of the sheet until the necks 71 are etched through. This separates regions of the copper sheet from one another, forming discrete contact pads analogous to those described in relation to the other embodiments.

As shown in FIG. 9*b*, the contact pads comprise outer pads 72 that lie outside the footprint of the die and inner pads 73 that lie inside the footprint of the die and are integral with conductive leads 74 which run from the pads 73 to points outside the footprint of the die where they attach to the wirebonding. The pads 73, 72 extend lower than the regions 74 to help reduce the chance of pads 72 being bridged to leads 74 when the pads are soldered to corresponding pads 68 on a PCB 69. The pads 72, 73 could be flush with the base of the packaging 64 or could extend below it as shown in FIG. 9*b*. The leads 74 could be flush with the packaging or could be recessed below it as shown in FIG. 9*b*.

In the embodiment of FIG. 9, leads 74 are exposed at the exterior of the package at points inside the footprint of the die 63 and also at points outside the footprint of the die. When the package is soldered to a PCB, contact will normally be made to the leads 74 at the pads 73, which are inside the footprint of the die, but contact could additionally or alternatively be made at points outside the footprint of the die.

Depending on the process that is being used, when wirebonding on to a lead is being performed it may be advantageous to reduce the length of the lead that is unsupported. In the embodiment of FIGS. 2 and 3 this can straightforwardly be achieved by performing the wirebonding with the sheet resting on a planar base. In the embodiment of FIGS. 4 and 5, if the wirebonding operation is performed with the leads on a planar base the thinner sections of the leads will only be supported at their ends. This can be avoided by supporting the leads on a profiled baseplate during the wirebonding operation. Such a profiled baseplate is shaped so as to make contact with the lower surfaces of the leads 52 and the regions 54, so that it can support all those portions when wirebonding takes place.

The techniques described above are particularly suitable for packaging integrated circuits, but may also be used for packaging other electronic devices.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features. In view of the foregoing description it will be evident to a person skilled in the art that various modifications may be made within the scope of the invention.

The invention claimed is:

1. An electronic device package comprising:
a block of insulating material;
an electronic device housed within the insulating material and having a set of contact pads thereon; and
a set of electrically conductive contact members at least partially housed within the insulating material, each contact member extending between a respective external contact point at which it is exposed at the surface of the block and an internal contact point from which it is electrically coupled to a respective contact pad on the electronic device, each internal contact point being outside the footprint of the electronic device, the set of contact members including:
at least one contact member of a first type having:
an external contact point that is located at least partially within the footprint of the electronic device;
a depth at its internal contact point that is less than its depth at its external contact point, and whose width at its internal contact point is less than its width at its external contact point, said width being parallel to the nearest side of the electronic device to said internal contact point; and
at least one contact member of a second type that is wholly outside the footprint of the device.

2. An electronic device package as claimed in claim 1, wherein a plurality of the contact members are arranged in a row along an edge of the electronic device, the contact members of the said plurality being alternately of the first type and the second type along the row.

3. An electronic device package as claimed in claim 2, wherein the said plurality of the contact members collectively extend parallel to an edge of the block of insulating material.

4. An electronic device package as claimed in claim 2, wherein the internal contact points of the said plurality of contact members are substantially collinear.

5. An electronic device package as claimed in claim 2, wherein the internal contact points of the contact members of the first type among the said plurality of contact members are located closer to the electronic device than the internal contact points of the contact members of the second type among the said plurality of contact members.

6. An electronic device package as claimed in claim 2, wherein the external contact points of adjacent pairs of the said plurality of contact members are substantially aligned in a direction perpendicular to the extent of the said plurality.

7. An electronic device package as claimed in claim 2, wherein the external contact points of adjacent contact members of the said plurality of contact members are offset in a direction parallel to the extent of the said plurality.

8. An electronic device package as claimed in claim 1, wherein the block of insulating material has a base at which the external contact points are exposed.

9. An electronic device package as claimed in claim 8, wherein each contact member of the second type is of a constant cross-section in a plane parallel to the base of the block of insulating material.

10. An electronic device package as claimed in claim 1, wherein each contact member of the first type is exposed at the surface of the block at locations both inside and outside the footprint of the electronic device.

11. An electronic device package as claimed in claim 1, wherein the contact members of the first type are exposed at the surface of the block of insulating material only inside the footprint of the electronic device.

12. An electronic device package as claimed in claim 1, wherein the surface closest to the device of the relatively shallow section of the contact member of the first type is co-planar with the surface closest to the device of the relatively deep section of the contact member of the first type.

13. An electronic device package as claimed in claim 1, wherein the contact members of the first type are formed of etched metal.

14. An electronic device package as claimed in claim 1, wherein each contact member is electrically coupled by a wire to the respective contact pad on the electronic device.

15. An electronic device package as claimed in claim 1, wherein each contact member is constituted by a unitary element of material.

16. An electronic device package as claimed in claim 1, wherein the external contact points of at least some of the contact members extend out of the block of insulating material.

17. An electronic device package as claimed in claim 1, wherein the contact members are located wholly within the block of insulating material.

18. An electronic device package as claimed in claim 1, comprising a further conductive member located wholly within the footprint of the electronic device and extending between a respective external contact point at which it is exposed at the surface of the block and an internal contact from which it is coupled to the electronic device.

19. An electronic device package as claimed in claim 18, wherein the further conductive member is a die attach pad.

20. An electronic device package as claimed in claim 1, wherein the electronic device is substantially planar.

21. An electronic device package as claimed in claim 1, wherein the electronic device is an integrated circuit die.

22. A circuit board having an electronic device package as claimed in claim 1 attached thereto, the external contact points of the package being soldered to respective contact points on the circuit board without solder bridging to nearby ones of the contact points.

23. A sheet of conductive material configured to define a plurality of contact members, the sheet being arranged in such a pattern as to be suitable for forming an electronic device package as claimed in claim 1.

24. A sheet of electrically conductive material for forming contact members of an electronic device package, the sheet being patterned to comprise:

support strips extending around a package region, the package region comprising an interior region and a peripheral region surrounding the interior region; and a plurality of fingers extending from the support strips into the package region to define contact members, the fingers including:

fingers of a first type, each of which fingers being arranged to:

extend from an associated support strip through the peripheral part of the package region into the interior part of the package region;

have a depth that is greater where that finger lies in the interior region than where that finger lies in the peripheral region; and have a width that is greater where that finger lies in the interior region than where that finger lies in the peripheral region, and fingers of a second type that extend from the strips only into the peripheral part of the package region.

25. A sheet as claimed in claim 24, wherein an upper surface of the relatively shallow section of the contact member of the first type is co-planar with an upper surface of the relatively deep section of the contact member of the first type.

26. A sheet as claimed in claim 24, wherein along at least part of a strip fingers of the first and second type alternate.

27. A sheet of electrically conductive material for forming contact members of a plurality of electronic device packages, the sheet comprising a plurality of sheets as claimed claim 24 interconnected by their strips.

28. A method of manufacturing an electronic device package, the method comprising:

attaching to an electronic device having a set of contact pads thereon a set of electrically conductive contact members, each contact member extending between a respective external contact point and an internal contact point from which it is electrically coupled to a respective contact pad on the electronic device, each internal contact point being outside the footprint of the electronic device and the set of contact members including at least one contact member of a first type having an external contact point that is located at least partially within the footprint of the electronic device, a depth at its internal contact point that is less than its depth at its external contact point, and a width at its internal contact point that is less than its width at its external contact point, said width being parallel to the nearest side of the electronic device to said internal contact point, and at least one contact member of a second type that is wholly outside the footprint of the device; and encapsulating the device in a block of insulating material such that the external contact points of the contact members are exposed at the surface of the block.

* * * * *

UNITED STATES PATENT AND TRADEMARK OFFICE
CERTIFICATE OF CORRECTION

| | | |
|---|---|---|
| PATENT NO. | : 8,508,032 B2 | Page 1 of 1 |
| APPLICATION NO. | : 12/742063 | |
| DATED | : August 13, 2013 | |
| INVENTOR(S) | : Owen et al. | |

It is certified that error appears in the above-identified patent and that said Letters Patent is hereby corrected as shown below:

In the Specification

<u>Column 1, Line 13</u>

"cross sections of four" should read --cross sections of five--

<u>Column 4, Line 66</u>

"At least a location" should be --At at least a location--

Signed and Sealed this
Eleventh Day of August, 2015

Michelle K. Lee
*Director of the United States Patent and Trademark Office*